(12) United States Patent
Fei et al.

(10) Patent No.: US 10,586,604 B1
(45) Date of Patent: Mar. 10, 2020

(54) SHIFT REGISTER, GATE DRIVING CIRCUIT, DISPLAY DEVICE, AND DRIVING METHOD THEREOF

(71) Applicant: Shanghai AVIC OPTO Electronics Co.,Ltd., Shanghai (CN)

(72) Inventors: Rili Fei, Shanghai (CN); Zhiqiang Xia, Shanghai (CN); Dandan Qin, Shanghai (CN); Dongliang Dun, Shanghai (CN); Shoufu Jian, Shanghai (CN); Tinghai Wang, Shanghai (CN); Ying Xie, Shanghai (CN); Houxun Xia, Shanghai (CN)

(73) Assignee: SHANGHAI AVIC OPTO ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/230,484

(22) Filed: Dec. 21, 2018

(30) Foreign Application Priority Data

Aug. 30, 2018 (CN) .......................... 2018 1 1001187

(51) Int. Cl.
*G11C 19/28* (2006.01)
*G09G 3/20* (2006.01)
*G06F 3/041* (2006.01)
(52) U.S. Cl.
CPC .......... *G11C 19/287* (2013.01); *G06F 3/0416* (2013.01); *G09G 3/20* (2013.01); *G09G 2300/0426* (2013.01); *G09G 2310/0286* (2013.01); *G09G 2310/08* (2013.01)

(58) Field of Classification Search
CPC ............. G09G 3/36; G09G 2310/0286; G09G 2310/0291; G09G 2310/08; G09G 2330/021; G11C 19/28
See application file for complete search history.

(56) References Cited

U.S. PATENT DOCUMENTS

2015/0325200 A1* 11/2015 Rho .......................... G09G 3/20
345/212
2018/0299988 A1* 10/2018 Chen ....................... G06F 3/044

FOREIGN PATENT DOCUMENTS

CN        205609225 U        9/2016

* cited by examiner

*Primary Examiner* — Nelson M Rosario
(74) *Attorney, Agent, or Firm* — Anova Law Group PLLC

(57) ABSTRACT

A shift register includes a forward/backward scan-control module, configured to transmit a signal of a forward-scan-signal terminal or a signal of a backward-scan-signal terminal to a first node; an interlock module, configured to transmit a signal of a first voltage terminal to a second node, and transmit a signal of a second voltage terminal to the first node; a pull-down module, configured to transmit the signal of the first voltage terminal to a gate-signal output terminal; an output module, configured to transmit a signal of a second clock-signal terminal to the gate-signal output terminal; and a reset module, configured to transmit the signal of the second voltage terminal to the first node, and transmit the signal of the first voltage terminal to the gate-signal output terminal. The disclosed shift register can prevent leakage of the first node, and thus improve the quality and the performance of the shift register.

20 Claims, 13 Drawing Sheets

SHIFT REGISTER, GATE DRIVING CIRCUIT, DISPLAY DEVICE, AND DRIVING METHOD THEREOF

CROSS-REFERENCES TO RELATED APPLICATIONS

This application claims the priority of Chinese patent application No. 201811001187.1, filed on Aug. 30, 2018, the entirety of which is incorporated herein by reference.

FIELD OF THE DISCLOSURE

The present disclosure generally relates to the field of display technology and, more particularly, relates to a shift register, a gate driving circuit, a display device, and a driving method thereof.

BACKGROUND

At the early stage for developing a touch display, a touch-control panel is bonded to a display panel to realize the touch display. The touch-control panel and the display panel need to be separately prepared before bonding together. Therefore, the cost is high, the thickness is large, and the production efficiency is low.

With the development of the in-cell touch display integration technology, the common electrode layer of the array substrate in the display panel can also be used as the touch-control electrode layer of the self-capacitive touch detection. Through a timing-sharing driving, touch control and display control can be performed in a time sequence, such that touch control and display functions can be implemented simultaneously. In this way, the touch-control electrode is directly integrated into the display panel, which greatly reduces the manufacturing cost, improves the production efficiency, and reduces the thickness of the panel. The operation stage of the display panel includes a display stage and a touch-control stage with the touch-control stage inserted in the middle of the display stage.

However, the display quality of display panels with touch-control functions according to existing technology still needs to be improved. The disclosed shift register, gate driving circuit, display device, and driving method are directed to solve one or more problems set forth above and other problems in the art.

BRIEF SUMMARY OF THE DISCLOSURE

One aspect of the present disclosure provides a shift register. The shift register includes a forward/backward (FW/BW) scan-control module, configured to, in response to a signal of a first control terminal, transmit a signal of a forward-scan-signal terminal to a first node, and in response to a signal of a second control terminal, transmit a signal of a backward-scan-signal terminal to the first node; an interlock module, configured to, in response to a signal of the first node, transmit a signal of a first voltage terminal to a second node, and in response to a signal of the second node, transmit a signal of a second voltage terminal to the first node; a pull-down module, configured to, in response to a signal of a first clock-signal terminal, transmit the signal of the first voltage terminal to a gate-signal output terminal; an output module, configured to, in response to the signal of the first node, transmit a signal of a second clock-signal terminal to the gate-signal output terminal; and a reset module, configured to, in response to a signal of a third control terminal, transmit the signal of the second voltage terminal to the first node, and in response to a signal of a fourth control terminal, transmit the signal of the first voltage terminal to the gate-signal output terminal.

Another aspect of the present disclosure provides a gate driving circuit. The gate driving circuit includes X cascaded shift registers, where X is an integer greater than or equal to 3. Each shift register of the X cascaded shift registers includes a FW/BW scan-control module, an interlock module, a pull-down module, an output module, and a reset module. The FW/BW scan-control module is configured to, in response to a signal of a first control terminal, transmit a signal of a forward-scan-signal terminal to a first node, and in response to a signal of a second control terminal, transmit a signal of a backward-scan-signal terminal to the first node. The interlock module is configured to, in response to a signal of the first node, transmit a signal of a first voltage terminal to a second node, and in response to a signal of the second node, transmit a signal of a second voltage terminal to the first node. The pull-down module is configured to, in response to a signal of a first clock-signal terminal, transmit the signal of the first voltage terminal to a gate-signal output terminal. The output module is configured to, in response to the signal of the first node, transmit a signal of a second clock-signal terminal to the gate-signal output terminal. the reset module is configured to, in response to a signal of a third control terminal, transmit the signal of the second voltage terminal to the first node, and in response to a signal of a fourth control terminal, transmit the signal of the first voltage terminal to the gate-signal output terminal.

Another aspect of the present disclosure provides a display device. The display device includes a display region and a non-display region. The display region includes a plurality of gate lines. The non-display region includes at least one gate driving circuit including the gate driving circuit according to the present disclosure. The at least one gate driving circuit is electrically connected to the plurality of gate lines.

Another aspect of the present disclosure provides a driving method for a display device. The display device includes a display region and a non-display region. The display region includes a plurality of gate lines. The non-display region includes at least one gate driving circuit electrically connected to the plurality of gate lines. Each gate driving circuit of the at least one gate driving circuit includes X cascaded shift registers, where X is an integer greater than or equal to 3. Each shift register of the X cascaded shift registers includes a FW/BW scan-control module, an interlock module, a pull-down module, an output module, and a reset module. The FW/BW scan-control module is configured to, in response to a signal of a first control terminal, transmit a signal of a forward-scan-signal terminal to a first node, and in response to a signal of a second control terminal, transmit a signal of a backward-scan-signal terminal to the first node. The interlock module is configured to, in response to a signal of the first node, transmit a signal of a first voltage terminal to a second node, and in response to a signal of the second node, transmit a signal of a second voltage terminal to the first node. The pull-down module is configured to, in response to a signal of a first clock-signal terminal, transmit the signal of the first voltage terminal to a gate-signal output terminal. The output module is configured to, in response to the signal of the first node, transmit a signal of a second clock-signal terminal to the gate-signal output terminal. the reset module is configured to, in response to a signal of a third control terminal, transmit the signal of the second voltage terminal to the first node, and in response to a signal of a fourth control terminal, transmit the signal of the first voltage terminal to the gate-signal output terminal. Within a time frame, an operation stage of the display device includes a plurality of display stages and a plurality of touch-control stages, the plurality of display stages alternating with the plurality of touch-control stages. The driving method for the display device includes in a display stage, setting the signal of the second voltage terminal to a low voltage level and setting the signal of the first terminal to a low voltage level; and in a touch-control stage, setting the signal of the second voltage terminal to a high voltage level and setting the signal of the first terminal to a low voltage level.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that the relative arrangement of the components and steps, numerical expressions and numerical values set forth in the embodiments are not intended to limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

In all of the examples shown and discussed herein, any specific values should be considered as illustrative only and not as a limitation. Therefore, other examples of exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
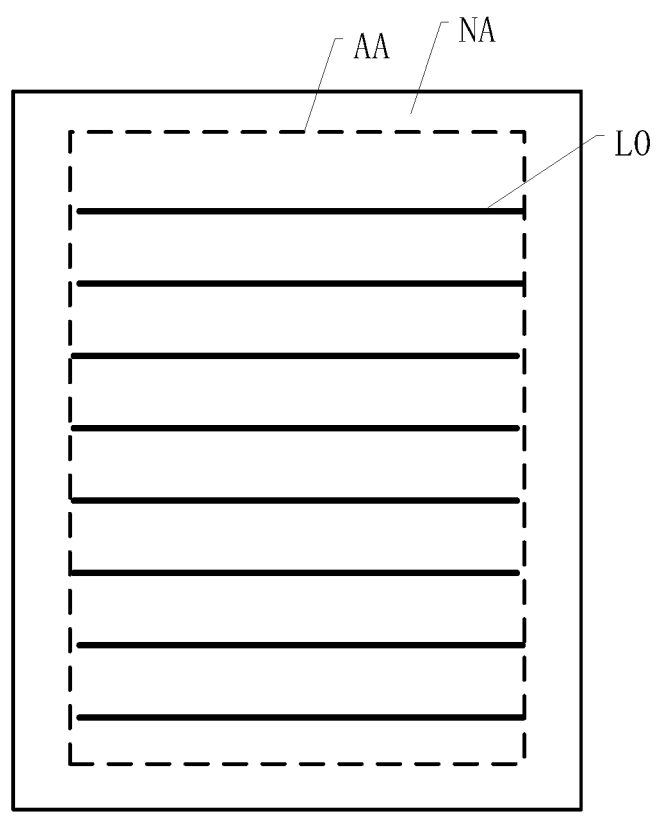
FIG. 1 illustrates a schematic planar view of a display panel.
Figure 2:
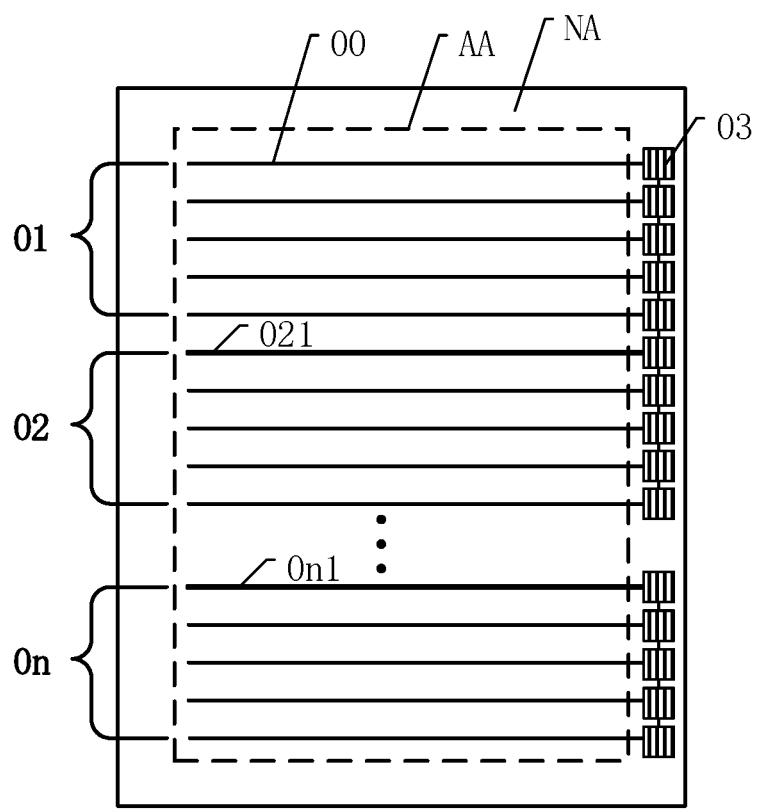
FIG. 2 illustrates a schematic planar view of another display panel.

FIG. 1 illustrates a schematic planar view of the structure of an existing display panel. FIG. 2 illustrates a schematic planar view of the structure of another existing display panel. Referring to FIG. 1 and FIG. 2, an existing display panel includes a display region AA and a non-display region NA. The display region AA includes a plurality of gate lines 00, and the non-display region NA includes a gate driving circuit. The gate driving circuit includes a plurality of shift registers 03, and the each shift register 03 is electrically connected to a corresponding gate line 00. The plurality of gate lines 00 are divided into n gate-line groups. For example, the n gate-line groups may be gate-line group 01, gate-line group 02, . . . , gate-line group 0n. The operation stage of the display panel includes a plurality of display stages and a plurality of touch-control stages. In each display stage, the gate driving circuit performs the driving operation for one gate-line group. For example, in the first display stage, the gate driving circuit performs the driving operation for the gate-line group 01, and then the display panel enters the first touch-control stage. In the first touch-control stage, the gate driving circuit suspends the driving operation for the gate-line group 01. After the first touch-control stage is completed, the display panel enters the second display stage, and the gate driving circuit performs the driving operation for the gate-line group 02. The first gate line of the gate-line group 02 is gate line 021. Because during the first touch-control stage, the gate driving circuit suspends the driving operation for the gate line 00, a leakage phenomenon may occur in the shift register 03 for driving the gate line 021, causing the shift register 03 to operate abnormally. Therefore, when entering the second display stage, the electrical signal that the shift register 03 provides to the gate line 021 is abnormal, such that the pixel (not shown) controlled by the gate line 021 displays abnormally. For example, referring to FIG. 1, the image displayed in the display area AA may have a horizontal line LO with low brightness, and thus the display quality of the display panel may be reduced.

Figure 3:
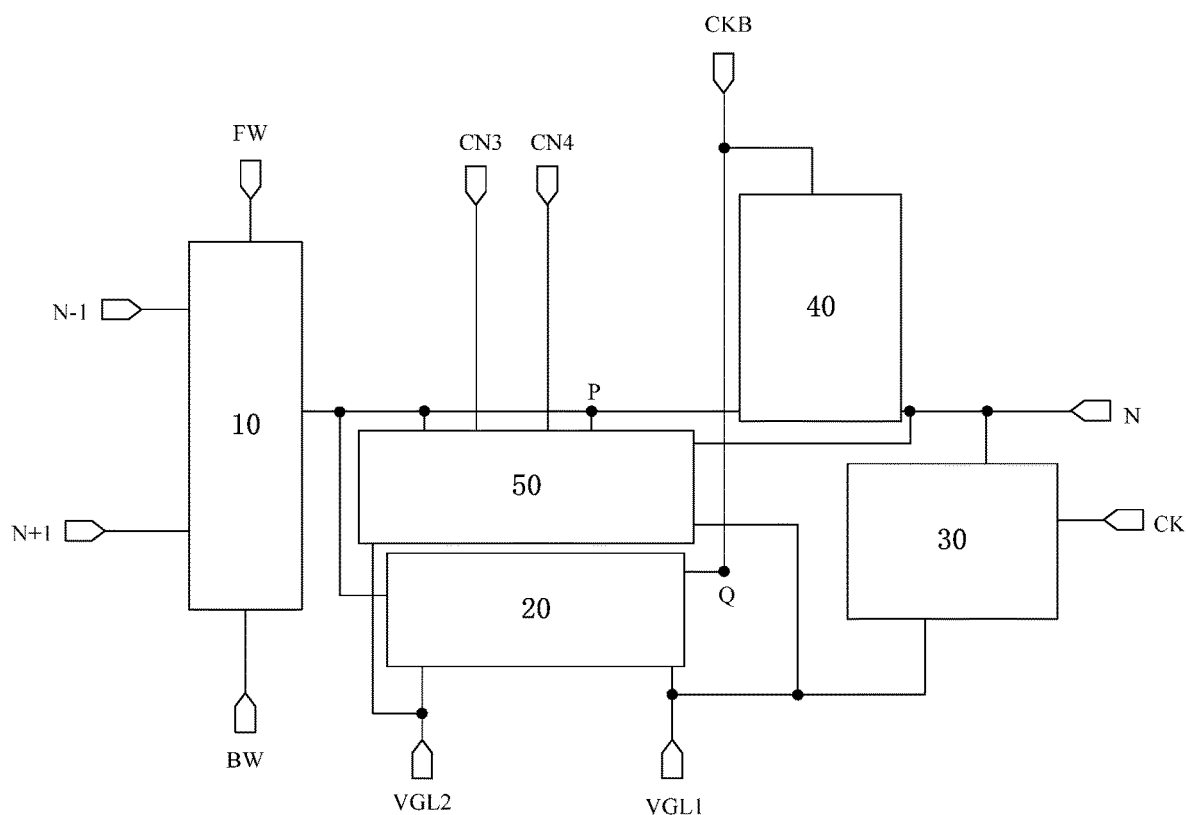
FIG. 3 illustrates a schematic diagram of a circuit structure of an exemplary shift register according to some embodiments of the present disclosure.

The present disclosure provides a shift register. FIG. 3 illustrates a schematic diagram of the circuit structure of an exemplary shift register according to some embodiments of the present disclosure. Referring to FIG. 3, the shift register may include a forward/backward (FW/BW) scan-control module 10, an interlock module 20, a pull-down module, an output module 40, and a reset module 50.

The FW/BW scan-control module 10 may be configured to, in response to a signal of the first control terminal N−1, transmit the signal of the forward-scan-signal terminal FW to a first node P, and in response to a signal of the second control terminal N+1, transmit the signal of the backward-scan-signal terminal BW to the first node P.

The interlock module 20 may be configured to, in response to the signal of the first node P, transmit the signal of the first voltage terminal VGL1 to the second node Q; and in response to the signal of the second node Q, transmit the signal of the second voltage terminal VGL2 to the first node P.

The pull-down module 30 may be configured to, in response to the signal of the first clock-signal terminal CK, transmit the signal of the first voltage terminal VGL1 to the gate-signal output terminal N.

The output module 40 may be configured to, in response to the signal of the first node P, transmit the signal of the second clock-signal terminal CKB to the gate-signal output terminal N.

The reset module 50 may be configured to, in response to the signal of the third control terminal CN3, transmit the signal of the second voltage terminal VGL2 to the first node P; and in response to the signal of the fourth control terminal CN4, transmit the signal of the first voltage terminal VGL1 to the gate-signal output terminal N.

According to the disclosed shift register, the signal of the first node P may control the output module 40 to output the gate signal to the gate-signal output terminal N. When the shift register is adopted in a display panel, the gate signal may be the driving signal used to drive a corresponding gate line. When the operation of the shift register is suspended, the voltage level at the first node P may drop down due to the leakage phenomenon, and when the shift register resumes operation, due to the drop in the voltage level at the first node P, the gate signal sent out from the output module 40 may be abnormal. According to the disclosed shift register, the shift register includes a first voltage terminal VGL1 and a second voltage terminal VGL2. The reset module 50 may transmit the signal of the second voltage terminal VGL2 to the first node P in response to the signal of the third control terminal CN3, and the interlock module 20 may transmit the signal of the second voltage terminal VGL2 to the first node in response to the signal of the second node Q. Therefore, when the operation of the shift register is suspended, by controlling the electrical signal of the second voltage terminal VGL2, the leakage between the first node P and the interlock module 20 through the reset module 50 may be prevented, such that the voltage level at the first node P may be maintained; when the shift register resumes operation, the voltage level maintained at the first node P may ensure that the output module 40 is able to output the gate signal normally. Therefore, the quality and the performance of the shift register may be improved.

In the following, detailed illustration of exemplary circuit structures of various modules of the disclosed shift register will be provided.

Figure 4:
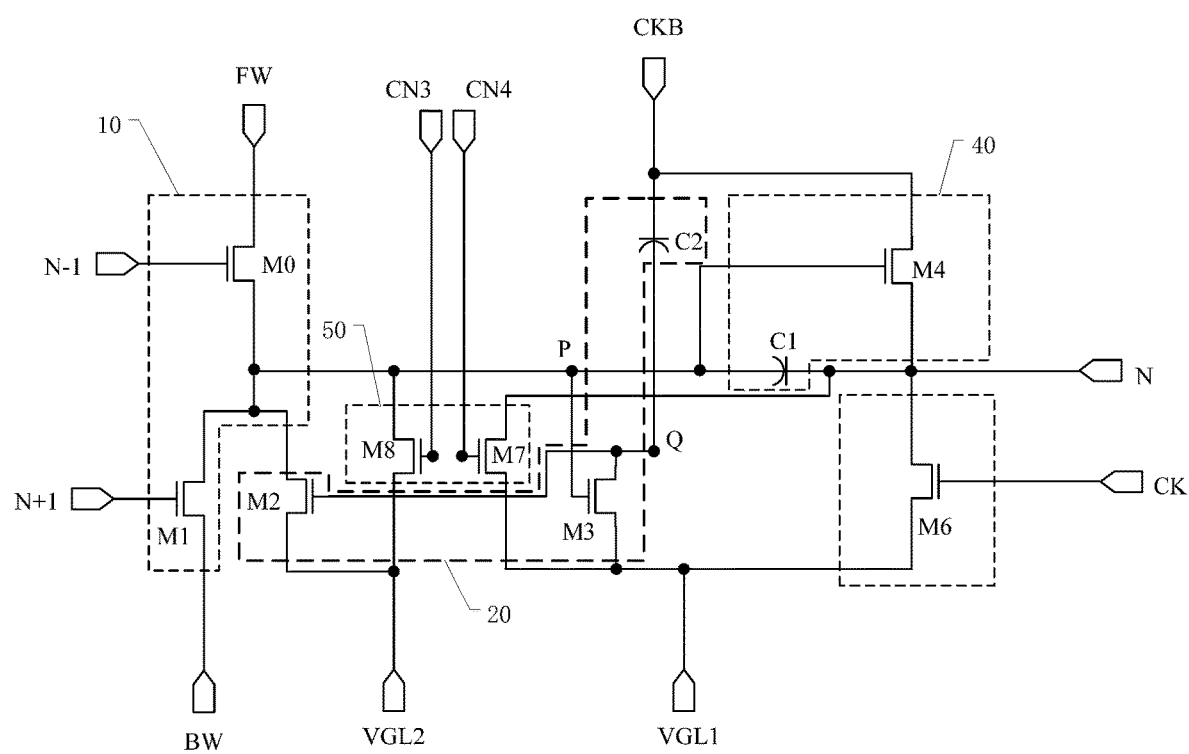
FIG. 4 illustrates a schematic diagram of a circuit structure of another exemplary shift register according to some embodiments of the present disclosure.

FIG. 4 illustrates a schematic diagram of the circuit structure of another exemplary shift register according to some embodiments of the present disclosure. Referring to FIG. 4, the FW/BW scan-control module 10 of the shift register may include a zeroth transistor M0 and a first transistor M1.

The gate of the zeroth transistor M0 may be electrically connected to the first control terminal N−1, the first terminal of the zeroth transistor M0 may be electrically connected to a forward-scan-signal terminal FW, and the second terminal of the zeroth transistor M0 may be electrically connected to the first node P.

The gate of the first transistor M1 may be electrically connected to the second control terminal N+1, the second terminal of the first transistor M1 may be electrically connected to a backward-scan-signal terminal BW, and the first terminal of the first transistor M1 may be electrically connected to the first node P.

In one embodiment, the electrical signal of the first control terminal N−1 may be able to control the zeroth transistor M0 to be turned on or turned off. When the zeroth transistor M0 is in the on state, the electrical signal of the forward-scan-signal terminal FW may be transmitted to the first node P. The electrical signal of the second control terminal N+1 may be able to control the first transistor M1 to be turned on or turned off. When the first transistor M1 is in the on state, the electrical signal of the backward-scan-signal terminal BW may be transmitted to the first node P. Therefore, when the disclosed shift register is adopted in a display panel, a forward-scan function and a backward-scan function may both be supported.

In some embodiments, referring to FIG. 4, the interlock module 20 may include a second transistor M2, a third transistor M3, and a second capacitor C2.

The gate of the second transistor M2 may be electrically connected to the second node Q, the second terminal of the second transistor M2 may be electrically connected to the second voltage terminal VGL2, and the first terminal of the second transistor M2 may be electrically connected to the first node P.

The gate of the third transistor M3 may be electrically connected to the first node P, the second terminal of the third transistor M3 may be electrically connected to the first voltage terminal VGL1, and the first terminal of the third transistor M3 may be electrically connected to the second node Q.

The second electrode plate of the second capacitor C2 may be electrically connected to the second node Q, and the first electrode plate of the second capacitor C2 may be electrically connected to the second clock-signal terminal CKB.

In one embodiment, the second capacitor C2 may be used to couple the signal of the second clock-signal terminal CKB to the electrical signal of the second node Q.

In one embodiment, the signal of the second node Q may be able to control the second transistor M2 to be turned on or turned off. When the second transistor M2 is in the on state, the electrical signal of the second voltage terminal VGL2 may be transmitted to the first node P. In addition, when the second transistor M2 is in the off state, the electrical signal of the second voltage terminal VGL2 may be controlled to be at a high voltage level, such that the high-voltage-level signal of the first node P may unlikely leak from the second transistor M2, thereby maintaining the stability of the electrical signal of the first node P. The signal of the first node P may control the third transistor M3 to be turned on or turned off. When the third transistor M3 is in the on state, the electrical signal of the first voltage terminal VGL1 may be transmitted to the second node Q.

Referring to FIG. 4, in some embodiments, the output module 40 of the disclosed shift register may include a fourth transistor M4 and a first capacitor C1.

The gate of the fourth transistor M4 may be electrically connected to the first node P, the first terminal of the fourth transistor M4 may be electrically connected to the second clock-signal terminal CKB, and the second terminal of the fourth transistor M4 may be electrically connected to the gate-signal output terminal N.

The first electrode plate of the first capacitor C1 may be electrically connected to the first node P, and the second electrode plate of the first capacitor C1 may be electrically connected to the gate-signal output terminal N.

In one embodiment, the signal of the first node P may be able to control the fourth transistor M4 to be turned on or turned off. When the fourth transistor M4 is in the on state, the signal of the second clock-signal terminal CKB may be transmitted to the gate-signal output terminal N. The first capacitor C1 may be used to couple the signal of the first node P to the signal of the gate-signal output terminal N.

Referring to FIG. 4, in some embodiments, the pull-down module 30 may include a sixth transistor M6.

The gate of the sixth transistor M6 may be electrically connected to the first clock-signal terminal CK, the second terminal of the sixth transistor M6 may be electrically connected to the first voltage terminal VGL1, and the first terminal of the sixth transistor M6 may be electrically connected to the gate-signal output terminal N.

In one embodiment, the signal of the first clock-signal terminal CK may be able to control the sixth transistor M6 to be turned on or turned off. When the sixth transistor M6 is in the on state, the signal of the first voltage terminal VGL1 may be transmitted to the gate-signal output terminal N.

Referring to FIG. 4, in some embodiments, the reset module 50 may include a seventh transistor M7 and an eighth transistor M8.

The gate of the seventh transistor M7 may be electrically connected to a fourth control terminal CN4, the second terminal of the seventh transistor M7 may be electrically connected to the first voltage terminal VGL1, and the first terminal of the seventh transistor M7 may be electrically connected to the gate-signal output terminal N.

The gate of the eighth transistor M8 may be electrically connected to a third control terminal CN3, the second terminal of the eighth transistor M8 may be electrically connected to the second voltage terminal VGL2, and the first terminal of the eighth transistor M8 may be electrically connected to the first node P.

In one embodiment, the signal of the fourth control terminal CN4 may be able to control the seventh transistor M7 to be turned on or turned off. When the seventh transistor M7 is in the on state, the signal of the first voltage terminal VGL1 may be transmitted to the gate-signal output terminal N. The signal of the third control terminal CN3 may be able to control the eighth transistor M8 to be turned on or turned off. When the eighth transistor M8 is in the on state, the signal of the second voltage terminal VGL2 may be transmitted to the first node P. In addition, when the eighth transistor M8 is in the off state, the electrical signal of the second voltage terminal VGL2 may be controlled to be at a high voltage level, such that the high voltage-level signal of the first node P may unlikely leak from the eighth transistor M8, thereby maintaining the stability of the electrical signal of the first node P.

Figure 5:
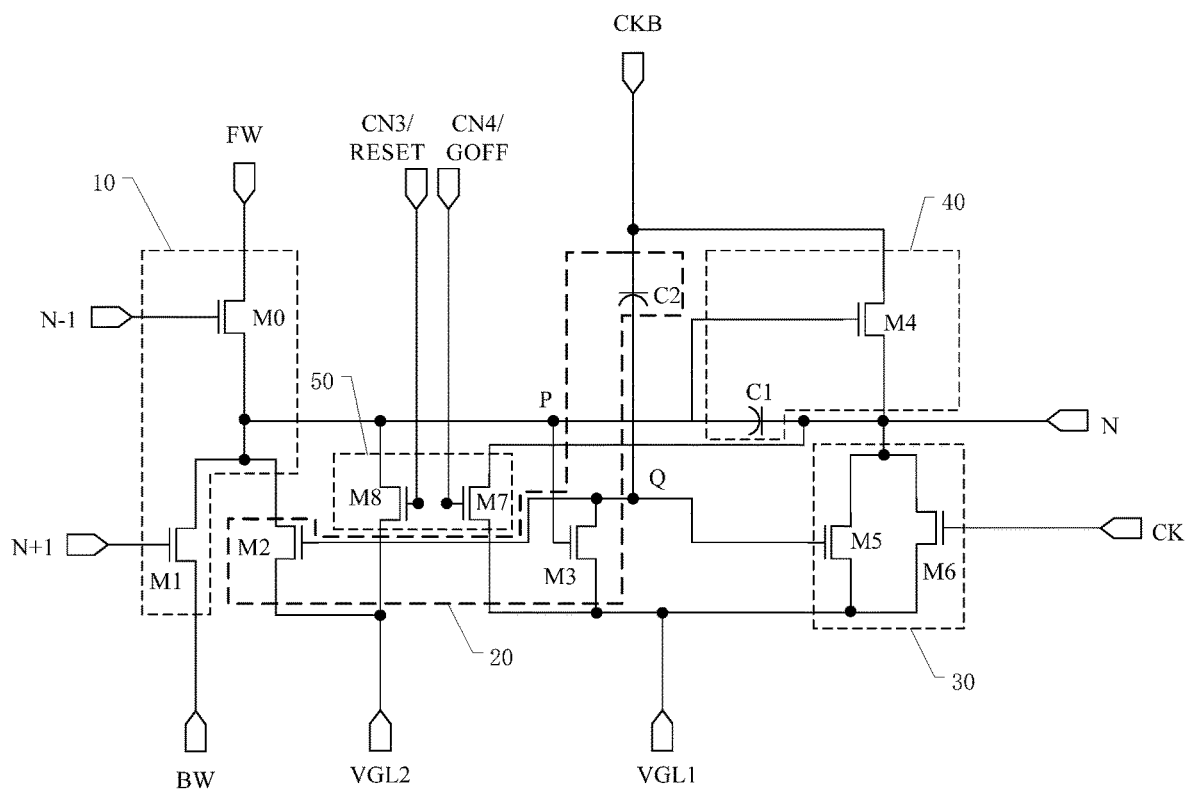
FIG. 5 illustrates a schematic diagram of a circuit structure of another exemplary shift register according to some embodiments of the present disclosure.

FIG. 5 illustrates a schematic diagram of the circuit structure of another exemplary shift register according to some embodiments of the present disclosure. Referring to FIG. 5, the pull-down module 30 of the disclosed shift register may further include a fifth transistor M5. The gate of the fifth transistor M5 may be electrically connected to the second node Q, the second terminal of the fifth transistor M5 may be electrically connected to the first voltage terminal VGL1, and the first terminal of the fifth transistor M5 may be electrically connected to the gate-signal output terminal N.

In one embodiment, the signal of the second node Q may be able to control the fifth transistor M5 to be turned on or turned off. When the fifth transistor M5 is in the on state, the signal of the first voltage terminal VGL1 may be transmitted to the gate-signal output terminal N. In the operation stage of the shift register, the fifth transistor M5 and the sixth transistor M6 may alternately pull down the gate-signal output terminal N, so that the gate-signal output terminal N may stably maintain a low voltage level except for the moment when the gate signal is outputted, which further ensures the accuracy of the gate signal from the gate-signal output terminal N, and thus improves the operation performance of the shift register.

Referring to FIG. 5, in some embodiments, the third control terminal CN3 may be electrically connected to a first reset-signal terminal RESET, and the fourth control terminal CN4 may be electrically connected to a second reset-signal terminal GOFF.

In one embodiment, the gate of the eighth transistor M8 may be electrically connected to the first reset-signal terminal RESET, the fourth control terminal CN4 may be electrically connected to the second reset-signal terminal GOFF. The first reset-signal terminal RESET and the second reset-signal terminal GOFF may control the seventh transistor M7 and the eighth transistor M8, respectively. When the operation of the shift register is suspended, the second reset-signal terminal GOFF may be able to control the seventh transistor M7 to be turned on, such that the signal of the first voltage terminal VGL1 may be transmitted to the gate-signal output terminal N to reset the voltage level at the gate-signal output terminal N. When the shift register resumes operation, the accuracy of the gate signal from the gate-signal output terminal N may be ensured, and thus the operation performance of the shift register may be improved.

Figure 6:
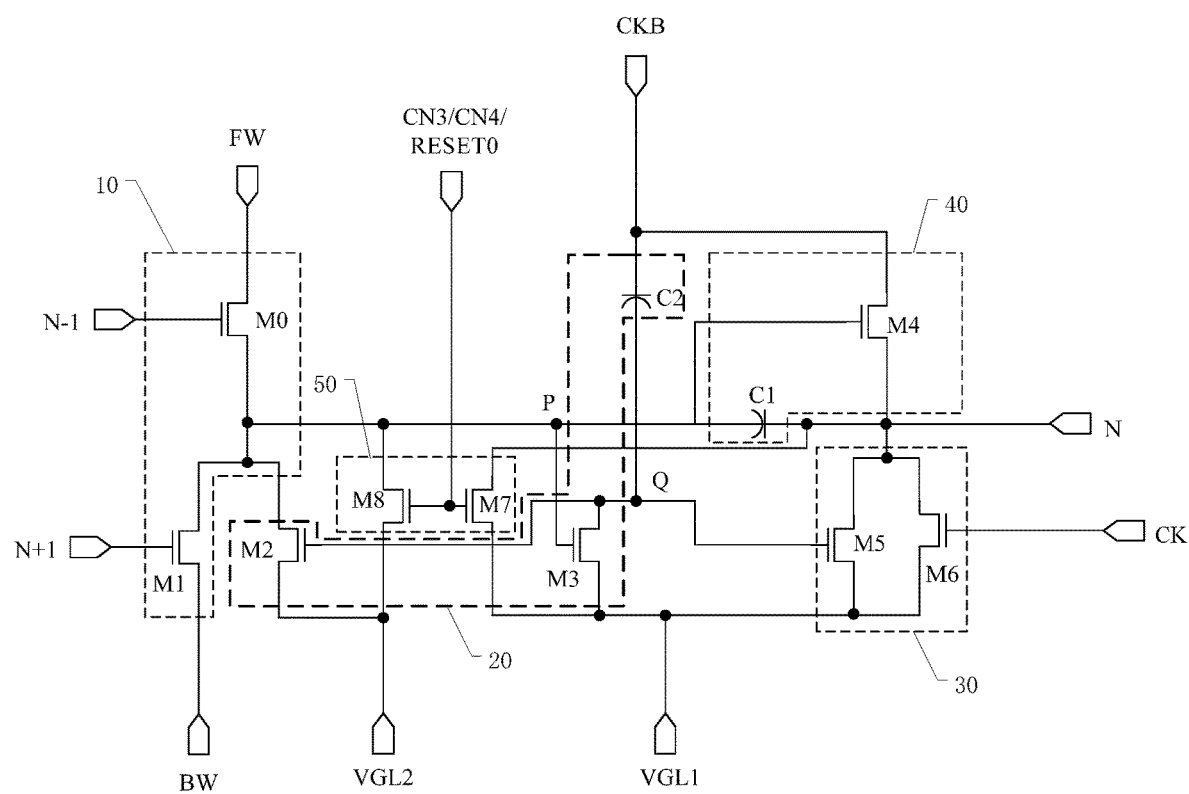
FIG. 6 illustrates a schematic diagram of a circuit structure of another exemplary shift register according to some embodiments of the present disclosure.

FIG. 6 illustrates a schematic diagram of the circuit structure of another exemplary shift register according to some embodiments of the present disclosure. Referring to FIG. 6, the third control terminal CN3 and the fourth control terminal CN4 may both be electrically connected to a reset-signal terminal RESET0. In one embodiment, the signal of only one reset-signal terminal, i.e. RESET0, may be used to control the seventh transistor M7 and the eighth transistor M8 to be turned on or turned off. As such, the number of the signal terminals in the disclosed shift register may be reduced, which may be conducive to simplifying the circuit structure of the shift register.

Figure 7:
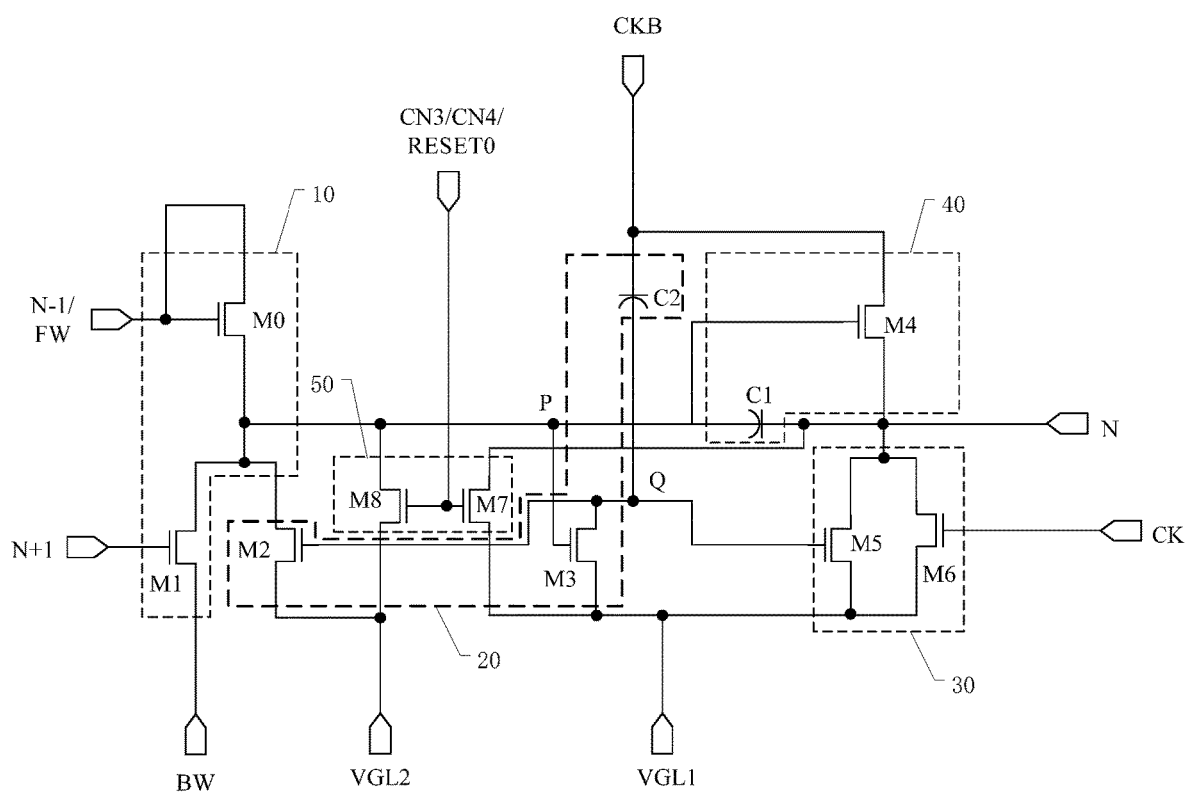
FIG. 7 illustrates a schematic diagram of a circuit structure of another exemplary shift register according to some embodiments of the present disclosure.

FIG. 7 illustrates a schematic diagram of the circuit structure of another exemplary shift register according to some embodiments of the present disclosure. Referring to FIG. 7, the forward-scan-signal terminal FW may be electrically connected to the first control terminal N−1. For the zeroth transistor M0 in the disclosed shift register, the gate may be electrically connected to the first terminal, such that the zeroth transistor M0 may serve as a diode. According to the operating characteristics of diode, the characteristic drift of the zeroth transistor M0 can be effectively suppressed, thereby preventing the first node P from leaking through the zeroth transistor M0. As such, the performance of the shift register may be further improved.

It should be noted that because the gate of the zeroth transistor M0 is electrically connected to the first terminal of the zeroth transistor M0, independent control of the electrical signal of the forward-scan-signal terminal FW may not be achieved. Therefore, the shift register according to the embodiment may only support unidirectional scan.

Moreover, it should be noted that according to basics of the shift registers illustrated in FIGS. 4-7, the FW/BW scan-control module 10, the interlock module 20, the pull-down module 30, the output module 40, and the reset module 50 may be implemented by various circuit structures, respectively. Therefore, FIGS. 4-7 are provided merely for illustrative purposes. That is, the circuit structures of the FW/BW scan-control module 10, the interlock module 20, the pull-down module 30, the output module 40, and the reset module 50 are not limited to the embodiments described above, and the modules in various embodiments may be implemented in a variety of other means and combinations.

Figure 8:
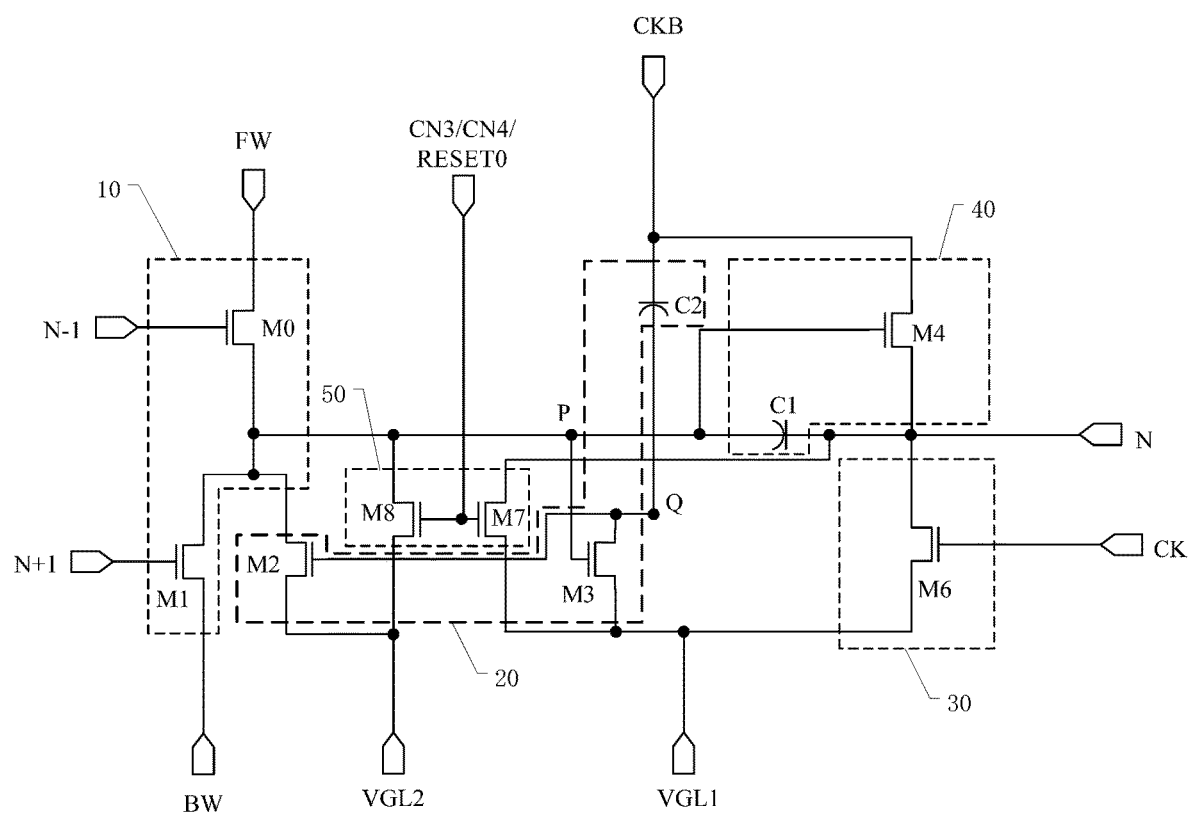
FIG. 8 illustrates a schematic diagram of a circuit structure of another exemplary shift register according to some embodiments of the present disclosure.

FIG. 8 illustrates a schematic diagram of the circuit structure of another exemplary shift register according to some embodiments of the present disclosure. Referring to FIG. 8 and FIG. 6, the shift register shown in FIG. 8 may be different from the shift register shown in FIG. 6. For example, the pull-down module 30 in the shift register shown in FIG. 8 includes only a sixth transistor M6, while the pull-down module 30 in the shift register shown in FIG. 8 also includes a fifth transistor M5 in addition to the sixth transistor M6. Therefore, the structure of the pull-down module 30 in the shift register shown in FIG. 8 is simplified, and thus the number of the transistors in the shift register may be reduced, which may be conducive to reducing the area occupied by the shift register. As such, applying such a shift register to a display panel may be conducive to minimizing the frame of the display panel.

Figure 9:
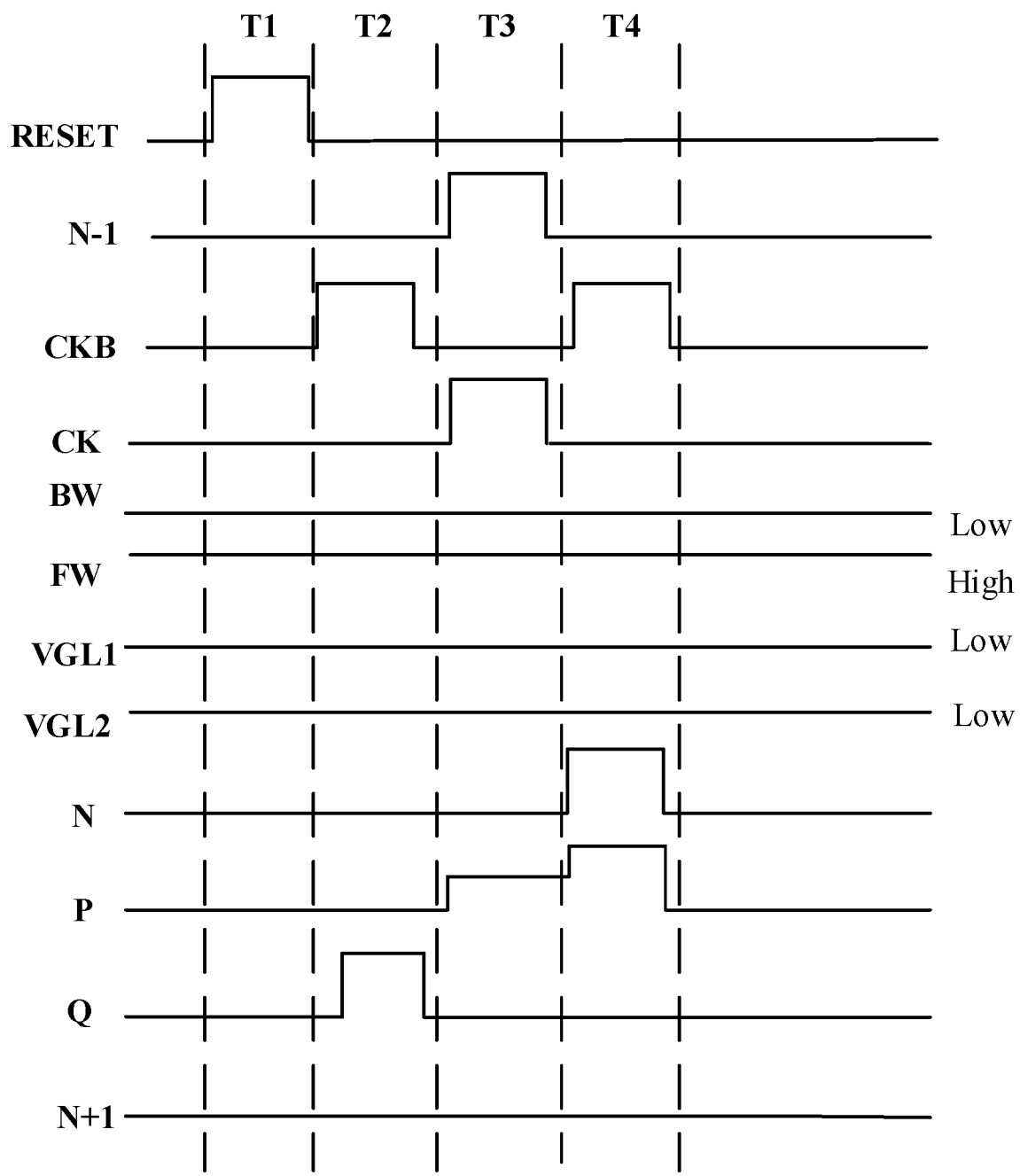
FIG. 9 illustrates a sequence diagram of the shift register shown in FIG. 6 according to some embodiments of the present disclosure.

In the following, the shift register shown in FIG. 6 will be described as an example to illustrate the normal operation sequence of the disclosed shift register. FIG. 9 illustrates a sequence diagram of the shift register shown in FIG. 6.

Referring to FIG. 9 and FIG. 6, at a first moment T1, the signal of the reset-signal terminal RESET0 may be at a high voltage level, the signal of the first control terminal N−1 may be at a low voltage level, the signal of the second clock-signal terminal CKB may be at a low voltage level, the signal of the first clock-signal terminal CK may be at a low voltage level, the signal of the backward-scan-signal terminal BW may be at a low voltage level, the signal of the forward-scan-signal terminal FW may be at a high voltage level, the signal of the first voltage terminal VGL1 may be at a low voltage level, the signal of the second voltage terminal VGL2 may be at a low voltage level, the signal of the gate-signal output terminal N may be at a low voltage level, the signal of the first node P may be at a low voltage level, and the signal of the second node Q may be at a low voltage level. At this moment, the high voltage-level signal of the reset-signal terminal RESET0 may control the seventh transistor M7 and the eighth transistor M8 to be turned on, such that the low voltage-level signal of the second voltage terminal VGL2 may be transmitted to the first node P to reset the voltage of the first node P, and the low voltage-level signal of the first voltage terminal VGL1 may be transmitted to the gate-signal output terminal N to reset the voltage of the gate-signal output terminal N.

At a second moment T2, the signal of the reset-signal terminal RESET0 may be at a low voltage level, the signal of the first control terminal N−1 may be at a low voltage level, the signal of the second clock-signal terminal CKB may be at a high voltage level, the signal of the first clock-signal terminal CK may be at a low voltage level, the signal of the backward-scan-signal terminal BW may be at a low voltage level, the signal of the forward-scan-signal terminal FW may be at a high voltage level, the signal of the first voltage terminal VGL1 may be at a low voltage level, the signal of the second voltage terminal VGL2 may be at a low voltage level, the signal of the gate-signal output terminal N may be at a low voltage level, the signal of the first node P may be at a low voltage level, and the signal of the second node Q may be at a high voltage level. At this moment, the second capacitor C2 may couple the high voltage-level signal of the second clock-signal terminal CKB to the second node Q, such that the signal of the second node Q may also be at a high voltage level. The high voltage-level signal of the second node may control the second transistor M2 and the fifth transistor M5 to be turned on, such that the low-voltage-level signal of the second voltage terminal VGL2 may be transmitted to the first node P, and the low voltage-level signal of the first voltage terminal VGL1 may be transmitted to the gate-signal output terminal N.

At a third moment T3, the signal of the reset-signal terminal RESET0 may be at a low voltage level, the signal of the first control terminal N−1 may be at a high voltage level, the signal of the second clock-signal terminal CKB may be at a low voltage level, the signal of the first clock-signal terminal CK may be at a high voltage level, the signal of the backward-scan-signal terminal BW may be at a low voltage level, the signal of the forward-scan-signal terminal FW may be at a high voltage level, the signal of the first voltage terminal VGL1 may be at a low voltage level, the signal of the second voltage terminal VGL2 may be at a low voltage level, the signal of the gate-signal output terminal N may be at a low voltage level, the signal of the first node P may be at a high voltage level, and the signal of the second node Q may be at a low voltage level. At this moment, the high voltage-level signal of the first clock-signal terminal CK may control the sixth transistor to be turned on, such that the low-voltage-level signal of the first voltage terminal VGL1 may be transmitted to the gate-signal output terminal N. The high voltage-level signal of the first control terminal N−1 may control the zeroth transistor M0 to be turned on, such that the high voltage-level signal of the forward-scan-signal terminal FW may be transmitted to the first node P. The first node P may control the third transistor M3 to be turned on, such that the voltage of the second node Q may be pulled down. The first node P may also control the fourth transistor M4 to be turned on, such that the signal of the second clock-signal terminal CKB may be at a low voltage level and the signal of the gate-signal output terminal N may also be at a low voltage level.

At a fourth moment T4, the signal of the reset-signal terminal RESET0 may be at a low voltage level, the signal of the first control terminal N−1 may be at a low voltage level, the signal of the second clock-signal terminal CKB may be at a high voltage level, the signal of the first clock-signal terminal CK may be at a low voltage level, the signal of the backward-scan-signal terminal BW may be at a low voltage level, the signal of the forward-scan-signal terminal FW may be at a high voltage level, the signal of the first voltage terminal VGL1 may be at a low voltage level, the signal of the second voltage terminal VGL2 may be at a low voltage level, the signal of the gate-signal output terminal N may be at a high voltage level, the signal of the first node P may be at a high voltage level, and the signal of the second node Q may be at a low voltage level. At this moment, under the sustained action of the second capacitor C2, the first node P may control the fourth transistor M4 to be turned on, the high voltage-level signal of the second clock-signal terminal CKB may be transmitted to the gate-signal output terminal N, and the voltage of the first node P may be pulled up. At this point, the shift register may complete outputting the gate signal, that is, the gate signal may be sent out from the gate-signal output terminal N.

Figure 10:
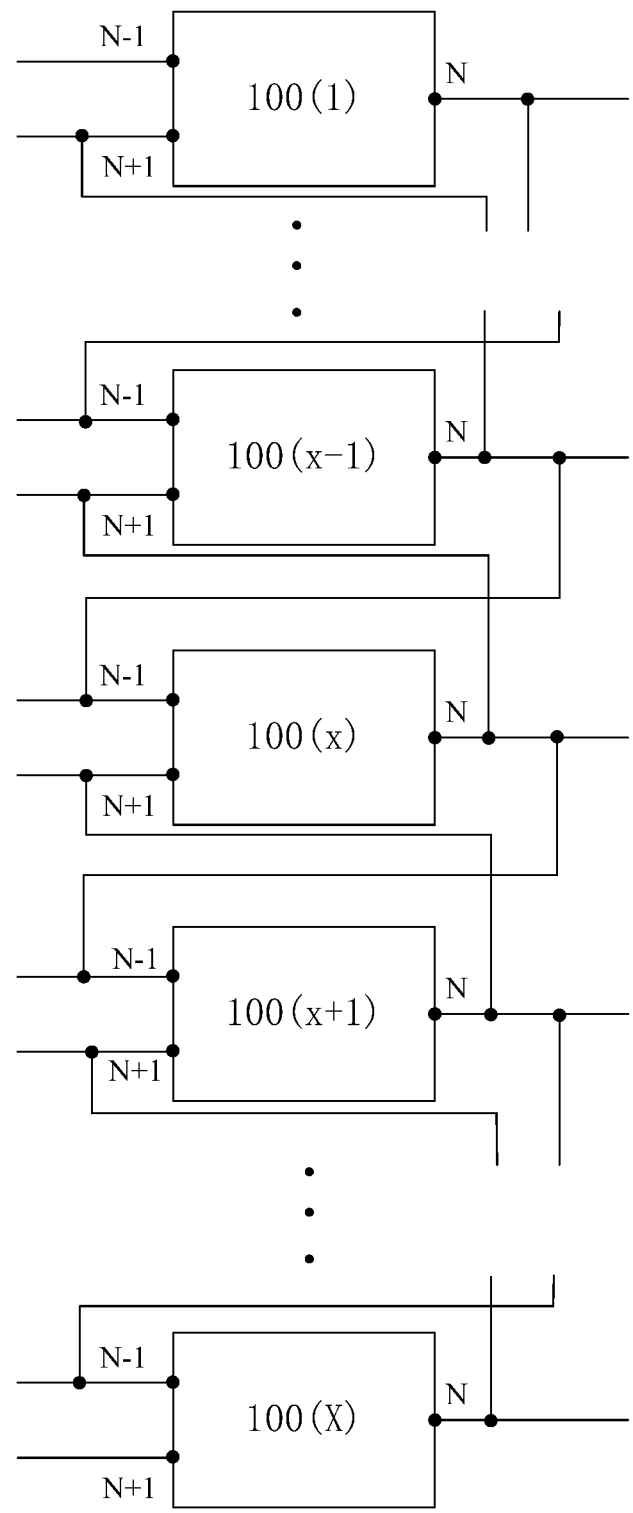
FIG. 10 illustrates a schematic diagram of an exemplary gate driving circuit according to some embodiments of the present disclosure.

Further, the present disclosure also provides a gate driving circuit. The gate driving circuit may include X cascaded shift registers according to the embodiments of the present disclosure, where X is a positive integer and X≥3. FIG. 10 illustrates a schematic diagram of the structure of an exemplary gate driving circuit according to some embodiments of the present disclosure. Referring to FIG. 10, a gate driving circuit 100A according the present disclosure may include a first shift register 100(1), a second shift register 100(2), . . . , and an (x)th shift register 100(X). It should be noted that X is a positive integer greater than or equal to 3. The specific value of X may be determined according to the actual needs, and the details of determining the value of X are not described in the present disclosure.

In some embodiments, referring to FIG. 10, the first control terminal N−1 of the (x)th shift register may be electrically connected to the gate-signal output terminal N of the (x−1)th shift register; and the second control terminal N+1 of the (x)th shift register may be electrically connected to the gate-signal output terminal N of the (x−1)th shift register, where x is a positive integer and 2≤x≤(X−1).

In one embodiment, the signal of the gate-signal output terminal N of the (x−1)th shift register may be multiplexed as the signal of the first control terminal N−1 of the (x)th shift register, and the signal of the gate-signal output terminal N of the (x+1)th shift register may be multiplexed as the signal of the second control terminal N+1 of the (x)th shift register. As such, the number of the signal terminals in the gate driving circuit may be reduced, and thus the structure of the circuit may be simplified.

The disclosed gate driving circuit may have the advantages that the shift registers according to the present disclosure demonstrate. For details of the advantages, reference may be made to the detailed description of the shift register provided in the above embodiments.

Figure 11:
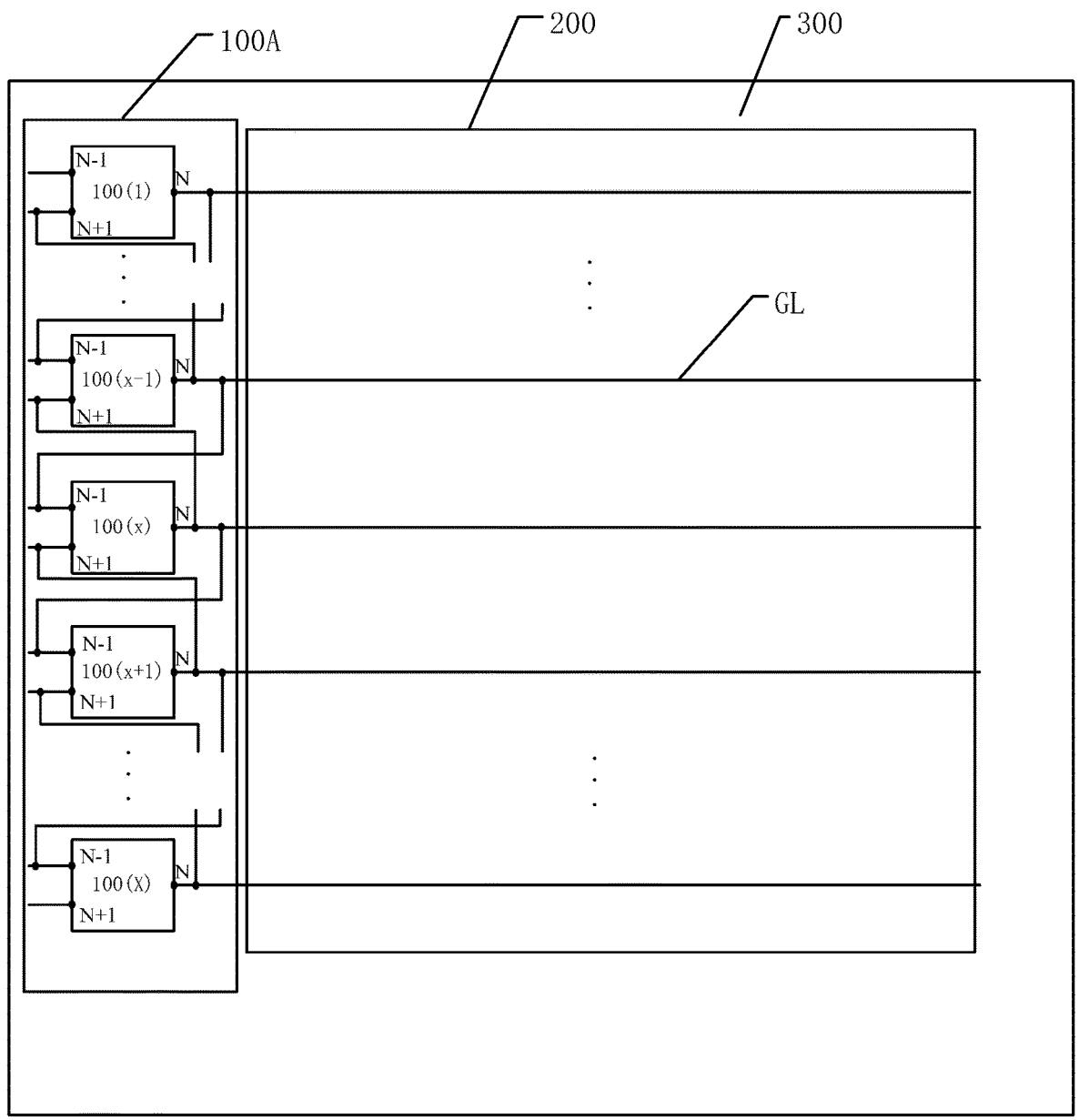
FIG. 11 illustrates a schematic planar view of an exemplary display device according to some embodiments of the present disclosure.

The present disclosure also provides a display device. FIG. 11 illustrates a schematic planar view of the structure of an exemplary display device according to some embodiments of the present disclosure. Referring to FIG. 11, the disclosed display device may include a display region 200 and a non-display region 300. The display region 200 may include a plurality of gate lines GL. The non-display region 300 may include a gate driving circuit 100A consistent with some embodiments of the present disclosure. The gate driving circuit 100A may be electrically connected to the plurality of gate lines GL.

In one embodiment, the gate driving circuit 100A may be used to provide driving signals for the plurality of gate lines GL. It should be noted that, in the embodiment illustrated in FIG. 11, a specific arrangement manner of a gate driving circuit 100A and the plurality of gate lines GL is provided. Referring to FIG. 11, the non-display region 200 may include a gate driving circuit 100A. The gate driving circuit 100A may be located only on one side of the display region 200. Each gate line GL may only have one end electrically connected to the gate-signal output terminal N of a corresponding shift register. In one embodiments of the present disclosure, the specific arrangement manner of the gate driving circuit and the plurality of gate lines may have a variety of options.

Figure 12:
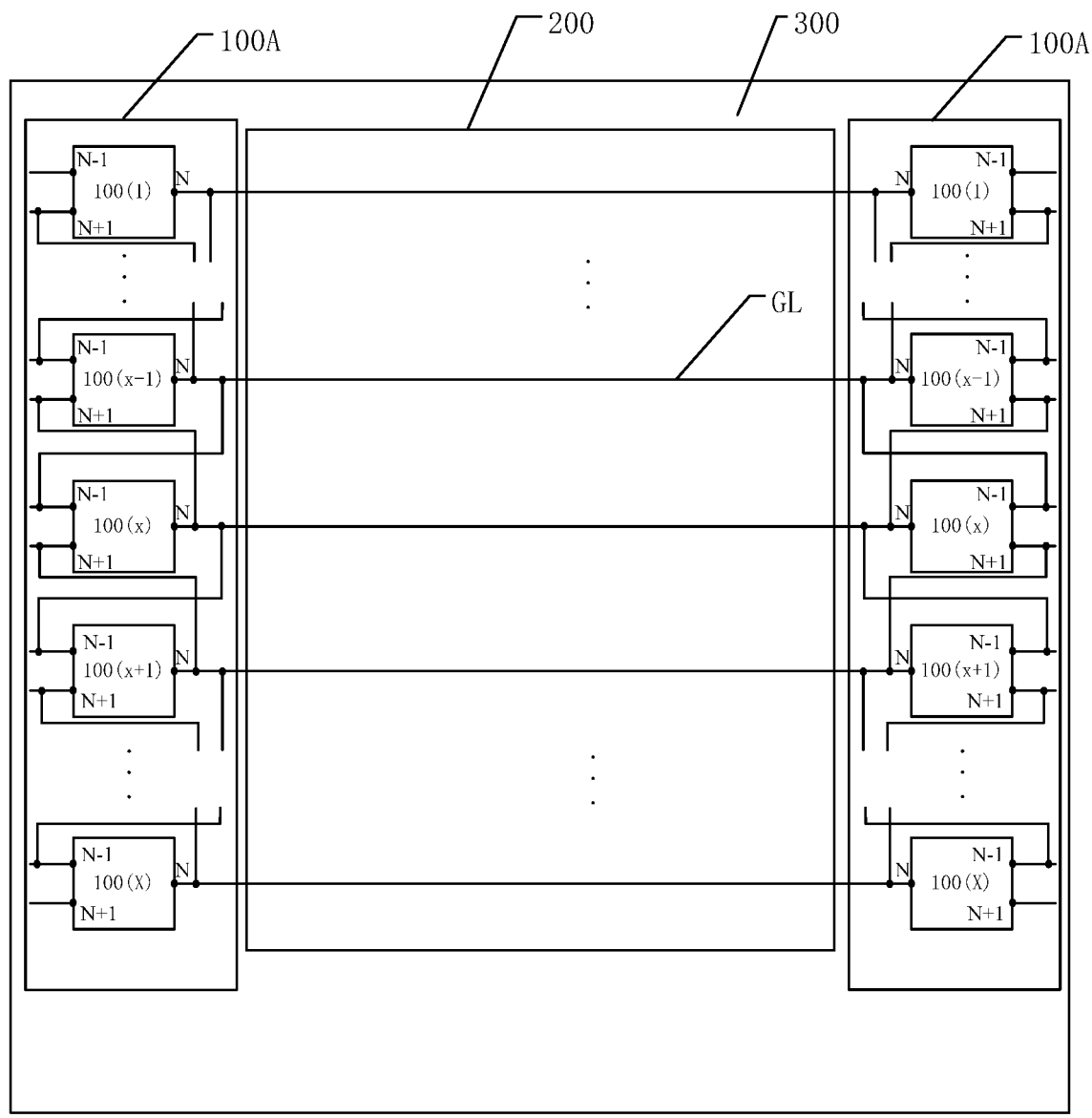
FIG. 12 illustrates a schematic planar view of another exemplary display device according to some embodiments of the present disclosure.

FIG. 12 illustrates a schematic planar view of the structure of another exemplary display device according to some embodiments of the present disclosure. Referring to FIG. 12, in one embodiment, the non-display region of the display device may include two gate driving circuits 100A, and the two gate driving circuits 100A may be arranged on the two opposite sides of the display region 200. For each gate line GL, the two ends of the gate line GL may be electrically connected to the gate-signal output terminals N of two shift registers, respectively. In the display device shown in FIG. 12, the two ends of each gate line GL may be able to simultaneously receive driving signals provided by the two gate driving circuits 100A, which may be conducive to the uniformity of the electrically signals on the gate line GL. In addition, when the size of the display device is large and the length of the GL is long, the advantages demonstrated by the display device illustrated in FIG. 12 may be more apparent.

It should be noted that FIGS. 11-12 illustrate only a specific arrangement manner of the gate driving circuit 100A and the plurality of gate lines GL, and the specific arrangement manner of the gate driving circuit 100A and the plurality of gate lines GL may have various options other than the specific arrangement manners illustrated in FIGS. 11-12.

Figure 13:
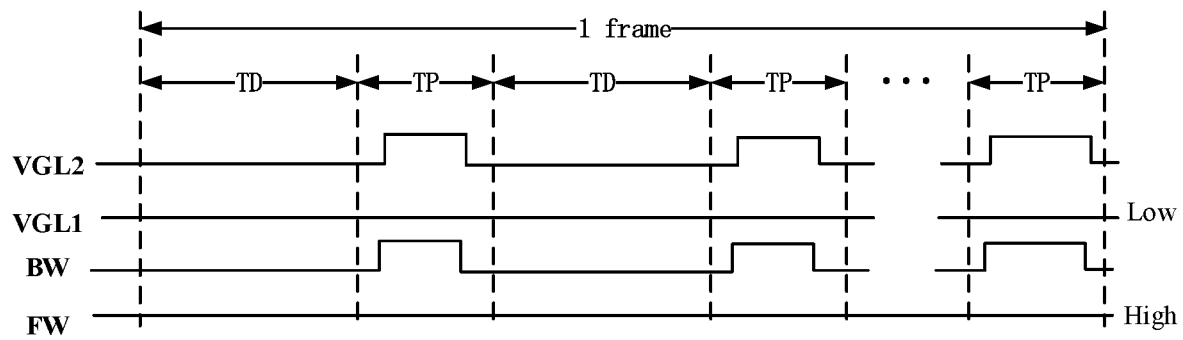
FIG. 13 illustrates a sequence diagram of an exemplary driving method for a display panel according to some embodiments of the present disclosure.

The present disclosure also provides a driving method for display devices. FIG. 13 illustrates a sequence diagram of an exemplary driving method for a display panel according to some embodiments of the present disclosure. Referring to FIG. 12 and FIG. 3, the display device may include a display region and a non-display region. The display region may include a plurality of gate lines, and the non-display region may include a gate driving circuit. The plurality of gate lines may be electrically connected to the gate driving circuit.

The gate driving circuit may include X cascaded shift registers. Each shift register may include a FW/BW scan-control module 10, an interlock module 20, a pull-down module 30, an output module 40, and a reset module 50.

The FW/BW scan-control module 10 may be configured to, in response to a signal of the first control terminal N−1, transmit the signal of the forward-scan-signal terminal FW to a first node P, and in response to a signal of the second control terminal N+1, transmit the signal of the backward-scan-signal terminal BW to the first node P.

The interlock module 20 may be configured to, in response to the signal of the first node P, transmit the signal of the first voltage terminal VGL1 to the second node Q; and in response to the signal of the second node Q, transmit the signal of the second voltage terminal VGL2 to the first node P.

The pull-down module 30 may be configured to, in response to the signal of the first clock-signal terminal CK, transmit the signal of the first voltage terminal VGL1 to the gate-signal output terminal N.

The output module 40 may be configured to, in response to the signal of the first node P, transmit the signal of the second clock-signal terminal CKB to the gate-signal output terminal N.

The reset module 50 may be configured to, in response to the signal of the third control terminal CN3, transmit the signal of the second voltage terminal VGL2 to the first node P; and in response to the signal of the fourth control terminal CN4, transmit the signal of the first voltage terminal VGL1 to the gate-signal output terminal N.

Within a time frame (1frame), the operation stage of the display device may include a plurality of display stages TD and a plurality of touch-control stages TD. The plurality of display stages TD may alternate with the plurality of touch-control stages.

During the display stage TD, the signal of the second voltage terminal VGL2 may be at a low voltage level, and the signal of the first voltage terminal VGL1 may also be at a low voltage level.

During the touch-control stage TP, the signal of the second voltage terminal VGL2 may be at a high voltage level, and the signal of the first voltage terminal VGL1 may be at a low voltage level.

According to the disclosed shift register, the shift register includes a first voltage terminal VGL1 and a second voltage terminal VGL2. The reset module 50 may transmit the signal of the second voltage terminal VGL2 to the first node P in response to the signal of the third control terminal CN3, and the interlock module 20 may transmit the signal of the second voltage terminal VGL2 to the first node in response to the signal of the second node Q. Therefore, during the display stage TD, the signal of the second voltage terminal VGL2 may be at a low voltage level in order to maintain a low-voltage-level signal for the first node P so that shift register may output the gate signal normally. In the touch-control state TP, the operation of the shift register may be suspended, that is, the shift register may suspend outputting the gate signal. In order to prevent the first node P from leaking, the signal of the second voltage terminal VGL2 may be at a high voltage level. As such, leaking from the first node P through the reset module 50 and the interlock module 20 may be prevented, and thus the voltage level at the first node P may be maintained. When the shift register resumes operation and re-enters the display stage TD, the output module 40 may be ensured to output the gate signal normally, and thus the quality and the performance of the shift register may be improved.

In some embodiments, referring to FIG. 6 and FIG. 13, the interlock module 20 may include a second transistor M2 and a third transistor M3. The gate of the second transistor M2 may be electrically connected to the second node Q, the second terminal of the second transistor M2 may be electrically connected to the second voltage terminal VGL2, and the first terminal of the second transistor M2 may be electrically connected to the first node P. The gate of the third transistor M3 may be electrically connected to the first node P, the second terminal of the third transistor M3 may be electrically connected to the first voltage terminal VGL1, and the first terminal of the third transistor M3 may be electrically connected to the second node Q. The reset module 50 may include a seventh transistor M7 and an eighth transistor M8. The gate of the seventh transistor M7 may be electrically connected to the fourth control terminal CN4, the second terminal of the seventh transistor M7 may be electrically connected to the first voltage terminal VGL1, and the first terminal of the seventh transistor M7 may be electrically connected to the gate-signal output terminal N. The gate of the eighth transistor M8 may be electrically connected to the third control terminal CN3, the second terminal of the eighth transistor M8 may be electrically connected to the second voltage terminal VGL2, and the first terminal of the eighth transistor M8 may be electrically connected to the first node P. During the touch-control stage TP, the operation of the shift register may be suspended, that is, the shift register may suspend outputting the gate signal; in addition, the signal of the second voltage terminal VGL2 may be at a high voltage level. Because both terminals of the second transistor M2 and both terminals of the eighth transistor M8 are all at a high voltage level, leaking from the first node P may be effectively prevented.

It should be noted that within a time frame, the specific numbers of the display stages TD and the touch-control stages TP may be determined according to the actual needs.

In some embodiments, referring to FIG. 3 and FIG. 13, during the display stage TD, the signal of the backward-scan-signal terminal BW may be at a low voltage level. During the touch-control stage TP, the signal of the backward-scan-signal terminal BW may be at a high voltage level. According to the present disclosure, during the display stage TD, the low voltage-level signal of the backward-scan-signal terminal BW may be used to pull down the voltage level at the first node P. During the touch-control stage TP, the operation of the shift register may be suspended. That is, the shift register may suspend outputting the gate signal. In order to prevent the first node P from leaking, the signal of the backward-scan-signal terminal BW may be at a high voltage level. As such, leaking from the first node P through the FW/BW scan-control module 10 may be prevented, and thus the voltage level at the first node P may be maintained. When the shift register resumes operation and re-enters the display stage TD, the output module 40 may be ensured to output the gate signal normally, and thus the quality and the performance of the shift register may be improved.

In some embodiments, referring to FIG. 6 and FIG. 13, the FW/BW scan-control module 10 may include a zeroth transistor M0 and a first transistor M1. The gate of the zeroth transistor M0 may be electrically connected to the first control terminal N−1, the first terminal of the zeroth transistor M0 may be electrically connected to a forward-scan-signal terminal FW, and the second terminal of the zeroth transistor M0 may be electrically connected to the first node P. The gate of the first transistor M1 may be electrically connected to the second control terminal N+1, the second terminal of the first transistor M1 may be electrically connected to a backward-scan-signal terminal BW, and the first terminal of the first transistor M1 may be electrically connected to the first node P. During the touch-control stage TP, the backward-scan-signal terminal BW may be at a high voltage level, the first node P may also be at a high voltage level. That is, both terminals of the first transistor M1 may be at a high voltage level. Therefore, leaking from the first node P may be effectively prevented, and thus the quality and the performance of the shift register may be further improved.

Figure 14:
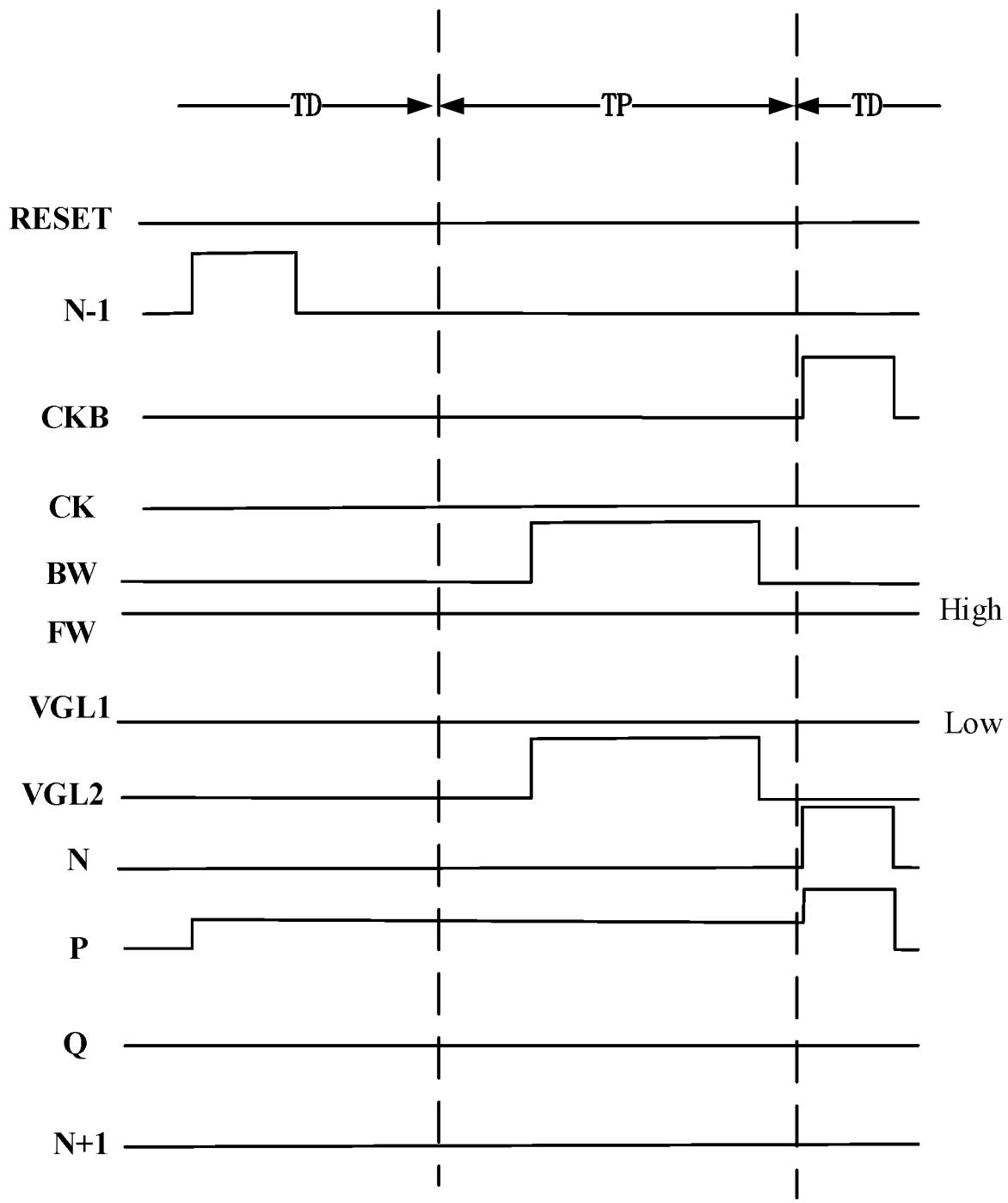
FIG. 14 illustrates a sequence diagram of another exemplary driving method for a display panel according to some embodiments of the present disclosure.

In the following, the shift register shown in FIG. 6 will be described as an example to illustrate the operation sequence of the shift register in the display device during the touch-control stage. FIG. 14 illustrates a sequence diagram of another exemplary driving method for a display panel according to some embodiments of the present disclosure.

Referring to FIG. 6 and FIG. 14, during the touch-control stage TP, the operation of the shift register may be suspended, the signal of the backward-scan-signal terminal BW may be at a high voltage level, the signal of the forward-scan-signal terminal FW may be at a high voltage level, the signal of the second voltage terminal VGL2 may be at a high voltage level, and the signal of the first node P may maintain a high voltage level. Moreover, the other terminals may all stay in a low-voltage state. That is, the signal of the reset-signal terminal RESET0 may be at a low voltage level, the signal of the first control terminal N−1 may be at a low voltage level, the signal of the second clock-signal terminal CKB may be at a low voltage level, the signal of the first clock-signal terminal CK may be at a low voltage level, the signal of the first voltage terminal VGL1 may be at a low voltage level, the signal of the gate-signal output terminal N may be at a low voltage level, and the signal of the second node Q may be at a low voltage level. According to the display device, during the touch-control stage TP of the shift register, the operation of the shift register may be suspended, that is, the shift register may suspend outputting the gate signal; in addition, the signal of the second voltage terminal VGL2 may be at a high voltage level. Because both terminals of the second transistor M2 and both terminals of the eighth transistor M8 are all at a high voltage level, leaking from the first node P may be effectively prevented. Moreover, the backward-scan-signal terminal BW may be at a high voltage level, the first node P may also be at a high voltage level. That is, both terminals of the first transistor M1 may be at a high voltage level. Therefore, leaking from the first node P may be effectively prevented, and thus the quality and the performance of the shift register may be further improved.

Compared to existing shift register, gate driving circuit, display device, and driving method, the disclosed shift register, gate driving circuit, display device, and driving method may demonstrate the following advantages.

According to the disclosed shift register, gate driving circuit, display device, and driving method, the shift register includes a first voltage terminal and a second voltage terminal. A reset module transmits the signal of the second voltage terminal to a first node in response to the signal of a third control terminal, and an interlock module transmits the signal of the second voltage terminal to the first node in response to the signal of a second node. Therefore, when the operation of the shift register is suspended, by controlling the electrical signal of the second voltage terminal, the leakage between the first node and the interlock module through the reset module is prevented, such that the voltage level at the first node is maintained; when the shift register resumes operation, the maintained voltage level at the first node ensures that the output module is able to output the gate signal normally. Therefore, the quality and the performance of the shift register are improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A shift register, comprising:
    a forward/backward (FW/BW) scan-control module, configured to, in response to a signal of a first control terminal, transmit a signal of a forward-scan-signal terminal to a first node, and in response to a signal of a second control terminal, transmit a signal of a backward-scan-signal terminal to the first node;
    an interlock module, configured to, in response to a signal of the first node, transmit a signal of a first voltage terminal to a second node, and in response to a signal of the second node, transmit a signal of a second voltage terminal to the first node;
    a pull-down module, configured to, in response to a signal of a first clock-signal terminal, transmit the signal of the first voltage terminal to a gate-signal output terminal;
    an output module, configured to, in response to the signal of the first node, transmit a signal of a second clock-signal terminal to the gate-signal output terminal; and
    a reset module, configured to, in response to a signal of a third control terminal, transmit the signal of the second voltage terminal to the first node, and in response to a signal of a fourth control terminal, transmit the signal of the first voltage terminal to the gate-signal output terminal.

2. The shift register according to claim 1, wherein:
the FW/BW scan-control module includes a zeroth transistor and a first transistor, wherein:
    a gate of the zeroth transistor is electrically connected to the first control terminal, a first terminal of the zeroth transistor is electrically connected to the forward-scan-signal terminal, and a second terminal of the zeroth transistor is electrically connected to the first node, and
    a gate of the first transistor is electrically connected to the second control terminal, a second terminal of the first transistor is electrically connected to the backward-scan-signal terminal, and a first terminal of the first transistor is electrically connected to the first node.

3. The shift register according to claim 1, wherein:
the interlock module includes a second transistor, a third transistor, and a second capacitor, wherein:
    a gate of the second transistor is electrically connected to the second node, a second terminal of the second transistor is electrically connected to the second voltage terminal, and a first terminal of the second transistor is electrically connected to the first node,
    a gate of the third transistor is electrically connected to the first node, a second terminal of the third transistor is electrically connected to the first voltage terminal, and a first terminal of the third transistor is electrically connected to the second node, and
    a second electrode plate of the second capacitor is electrically connected to the second node, and a first electrode plate of the second capacitor is electrically connected to the second clock-signal terminal.

4. The shift register according to claim 1, wherein:
the output module includes a fourth transistor and a first capacitor, wherein:
    a gate of the fourth transistor is electrically connected to the first node, a first terminal of the fourth transistor is electrically connected to the second clock-signal terminal, and a second terminal of the fourth transistor is electrically connected to the gate-signal output terminal, and
    a first electrode plate of the first capacitor is electrically connected to the first node, and a second electrode plate of the first capacitor is electrically connected to the gate-signal output terminal.

5. The shift register according to claim 1, wherein:
the pull-down module includes a sixth transistor, wherein:
    a gate of the sixth transistor is electrically connected to the first clock-signal terminal, a second terminal of the sixth transistor is electrically connected to the first voltage terminal, and a first terminal of the sixth transistor is electrically connected to the gate-signal output terminal.

6. The shift register according to claim 5, wherein:
the pull-down module further includes a fifth transistor, wherein:
    a gate of the fifth transistor is electrically connected to the second node, a second terminal of the fifth transistor is electrically connected to the first voltage terminal, and a first terminal of the fifth transistor is electrically connected to the gate-signal output terminal.

7. The shift register according to claim 1, wherein:
the reset module includes a seventh transistor and an eighth transistor, wherein:
a gate of the seventh transistor is electrically connected to the fourth control terminal, a second terminal of the seventh transistor is electrically connected to the first voltage terminal, and a first terminal of the seventh transistor is electrically connected to the gate-signal output terminal, and
a gate of the eighth transistor is electrically connected to the third control terminal, a second terminal of the eighth transistor is electrically connected to the second voltage terminal, and a first terminal of the eighth transistor is electrically connected to the first node.

8. The shift register according to claim 7, wherein:
the third control terminal is electrically connected to a first reset-signal terminal; and
the fourth control terminal is electrically connected to a second reset-signal terminal.

9. The shift register according to claim 7, wherein:
the third control terminal and the fourth control terminal are both electrically connected to a reset-signal terminal.

10. The shift register according to claim 1, wherein:
the forward-scan-signal terminal is electrically connected to the first control terminal.

11. A gate driving circuit, comprising X cascaded shift registers, where X is an integer greater than or equal to 3, wherein:
each shift register of the X cascaded shift registers includes a FW/BW scan-control module, an interlock module, a pull-down module, an output module, and a reset module, wherein:
the FW/BW scan-control module is configured to, in response to a signal of a first control terminal, transmit a signal of a forward-scan-signal terminal to a first node, and in response to a signal of a second control terminal, transmit a signal of a backward-scan-signal terminal to the first node,
the interlock module is configured to, in response to a signal of the first node, transmit a signal of a first voltage terminal to a second node, and in response to a signal of the second node, transmit a signal of a second voltage terminal to the first node,
the pull-down module is configured to, in response to a signal of a first clock-signal terminal, transmit the signal of the first voltage terminal to a gate-signal output terminal,
the output module is configured to, in response to the signal of the first node, transmit a signal of a second clock-signal terminal to the gate-signal output terminal, and
the reset module is configured to, in response to a signal of a third control terminal, transmit the signal of the second voltage terminal to the first node, and in response to a signal of a fourth control terminal, transmit the signal of the first voltage terminal to the gate-signal output terminal.

12. The gate driving circuit according to claim 11, wherein:
for an (x)th shift register, where x is a positive integer and $2 \leq x \leq (X-1)$, a first control terminal of the (x)th shift register is electrically connected to a gate-signal output terminal of an (x−1)th shift register, and a second control terminal of the (x)th shift register is electrically connected to a gate-signal output terminal of an (x+1)th shift register.

13. The gate driving circuit according to claim 11, wherein:
in the each shift register of the X cascaded shift registers, the FW/BW scan-control module includes a zeroth transistor and a first transistor, wherein:
a gate of the zeroth transistor is electrically connected to the first control terminal, a first terminal of the zeroth transistor is electrically connected to the forward-scan-signal terminal, and a second terminal of the zeroth transistor is electrically connected to the first node, and
a gate of the first transistor is electrically connected to the second control terminal, a second terminal of the first transistor is electrically connected to the backward-scan-signal terminal, and a first terminal of the first transistor is electrically connected to the first node;
in the each shift register of the X cascaded shift registers, the interlock module includes a second transistor, a third transistor and a second capacitor, wherein:
a gate of the second transistor is electrically connected to the second node, a second terminal of the second transistor is electrically connected to the second voltage terminal, and a first terminal of the second transistor is electrically connected to the first node,
a gate of the third transistor is electrically connected to the first node, a second terminal of the third transistor is electrically connected to the first voltage terminal, and a first terminal of the third transistor is electrically connected to the second node, and
a second electrode plate of the second capacitor is electrically connected to the second node, and a first electrode plate of the second capacitor is electrically connected to the second clock-signal terminal;
in the each shift register of the X cascaded shift registers, the output module includes a fourth transistor and a first capacitor, wherein:
a gate of the fourth transistor is electrically connected to the first node, a first terminal of the fourth transistor is electrically connected to the second clock-signal terminal, and a second terminal of the fourth transistor is electrically connected to the gate-signal output terminal, and
a first electrode plate of the first capacitor is electrically connected to the first node, and a second electrode plate of the first capacitor is electrically connected to the gate-signal output terminal;
in the each shift register of the X cascaded shift registers, the pull-down module includes a sixth transistor, wherein:
a gate of the sixth transistor is electrically connected to the first clock-signal terminal, a second terminal of the sixth transistor is electrically connected to the first voltage terminal, and a first terminal of the sixth transistor is electrically connected to the gate-signal output terminal; and
in the each shift register of the X cascaded shift registers, the reset module includes a seventh transistor and an eighth transistor, wherein:
a gate of the seventh transistor is electrically connected to the fourth control terminal, a second terminal of the seventh transistor is electrically connected to the first voltage terminal, and a first terminal of the seventh transistor is electrically connected to the gate-signal output terminal, a gate of the eighth transistor is electrically connected to the third control terminal, a second terminal of the eighth transistor is electrically connected to the second voltage terminal, and a first terminal of the eighth transistor is electrically connected to the first node.

14. The gate driving circuit according to claim 13, wherein:

in the each shift register of the X cascaded shift registers, the pull-down module further includes a fifth transistor, wherein:

a gate of the fifth transistor is electrically connected to the second node, a second terminal of the fifth transistor is electrically connected to the first voltage terminal, and a first terminal of the fifth transistor is electrically connected to the gate-signal output terminal.

15. The gate driving circuit according to claim 13, wherein:

in the each shift register of the X cascaded shift registers, the third control terminal is electrically connected to a first reset-signal terminal; and the fourth control terminal is electrically connected to a second reset-signal terminal.

16. The gate driving circuit according to claim 13, wherein:

in the each shift register of the X cascaded shift registers, the third control terminal and the fourth control terminal are both electrically connected to a reset-signal terminal.

17. The gate driving circuit according to claim 13, wherein:

in the each shift register of the X cascaded shift registers, the forward-scan-signal terminal is electrically connected to the first control terminal.

18. A display device, comprising:

a display region and a non-display region, wherein:

the display region includes a plurality of gate lines; and the non-display region includes at least one gate driving circuit including the gate driving circuit according to claim 11, wherein:

the at least one gate driving circuit is electrically connected to the plurality of gate lines.

19. A driving method for a display device, wherein:

the display device includes a display region and a non-display region, wherein:

the display region includes a plurality of gate lines; and the non-display region includes at least one gate driving circuit electrically connected to the plurality of gate lines, wherein:

each gate driving circuit of the at least one gate driving circuit includes X cascaded shift registers, where X is an integer greater than or equal to 3, wherein:

each shift register of the X cascaded shift registers includes a FW/BW scan-control module, an interlock module, a pull-down module, an output module, and a reset module, wherein:

the FW/BW scan-control module is configured to, in response to a signal of a first control terminal, transmit a signal of a forward-scan-signal terminal to a first node; and in response to a signal of a second control terminal, transmit a signal of a backward-scan-signal terminal to the first node, the interlock module is configured to, in response to a signal of the first node, transmit a signal of a first voltage terminal to a second node;

and in response to a signal of the second node, transmit a signal of a second voltage terminal to the first node, the pull-down module is configured to, in response to a signal of a first clock-signal terminal, transmit the signal of the first voltage terminal to a gate-signal output terminal, the output module is configured to, in response to the signal of the first node, transmit a signal of a second clock-signal terminal to the gate-signal output terminal, the reset module is configured to, in response to a signal of a third control terminal, transmit the signal of the second voltage terminal to the first node; and in response to a signal of a fourth control terminal, transmit the signal of the first voltage terminal to the gate-signal output terminal, within a time frame, an operation stage of the display device includes a plurality of display stages and a plurality of touch-control stages, the plurality of display stages alternating with the plurality of touch-control stages; and the driving method for the display device includes:

in a display stage, setting the signal of the second voltage terminal to a low voltage level and setting the signal of the first terminal to a low voltage level; and in a touch-control stage, setting the signal of the second voltage terminal to a high voltage level and setting the signal of the first terminal to a low voltage level.

20. The driving method according to claim 19, further including:

in the display stage, setting the signal of the backward-scan-signal terminal to a low voltage level; and in the touch-control stage, setting the signal of the backward-scan-signal terminal to a high voltage level.

* * * * *